(12) United States Patent  
Newman et al.

(10) Patent No.: US 8,011,381 B2
(45) Date of Patent: Sep. 6, 2011

(54) BALANCED PURGE SLIT VALVE

(75) Inventors: Jacob Newman, Palo Alto, CA (US); Douglas H. Burns, Saratoga, CA (US)

(73) Assignee: Applied Material, Inc., Santa Clara, CA (US)

( * ) Notice: Subject to any disclaimer, the term of this patent is extended or adjusted under 35 U.S.C. 154(b) by 435 days.

(21) Appl. No.: 12/244,643

(22) Filed: Oct. 2, 2008

(65) Prior Publication Data

US 2010/0084398 A1   Apr. 8, 2010

(51) Int. Cl.
*B65D 43/14*   (2006.01)
*F16K 27/00*   (2006.01)

(52) U.S. Cl. .................... 137/240; 251/366; 220/263

(58) Field of Classification Search .................. 137/240, 137/487.5; 251/366, 62; 220/263
See application file for complete search history.

(56) References Cited

U.S. PATENT DOCUMENTS

| | | | |
|---|---|---|---|
| 5,579,718 A | 12/1996 | Freerks | |
| 6,032,419 A * | 3/2000 | Hurwitt | 137/1 |
| 6,056,267 A | 5/2000 | Schneider | |
| 6,764,265 B2 | 7/2004 | Kunze et al. | |
| 6,814,813 B2 | 11/2004 | Dando et al. | |
| 7,128,085 B2 * | 10/2006 | DeCourcy et al. | 137/240 |
| 7,427,425 B2 | 9/2008 | Carpenter et al. | |
| 7,614,418 B2 * | 11/2009 | Pieri | 137/240 |
| 2003/0140988 A1 * | 7/2003 | Gandikota et al. | 148/527 |
| 2004/0166697 A1 | 8/2004 | Wang et al. | |
| 2005/0208217 A1 | 9/2005 | Shinriki et al. | |
| 2007/0107598 A1 | 5/2007 | Lee | |
| 2008/0026162 A1 | 1/2008 | Dickey et al. | |
| 2008/0296304 A1 | 12/2008 | Tran et al. | |

FOREIGN PATENT DOCUMENTS

| | | |
|---|---|---|
| JP | 2000114179 A | 4/2000 |
| KR | 20070071084 A | 7/2007 |

OTHER PUBLICATIONS

International Search Report and Written Opinion of the International Searching Authority mailed Apr. 15, 2010 in PCT/US2009/057538.

* cited by examiner

*Primary Examiner* — Kevin Lee
(74) *Attorney, Agent, or Firm* — Patterson & Sheridan, L.L.P.

(57) ABSTRACT

Methods and apparatus for providing a gas to a slit valve opening are provided herein. In one embodiment, a slit valve is described. The slit valve includes a housing having an opening, the opening defined by a plurality of interior sidewalls and sized to allow a substrate to pass therethrough, a door adapted to selectively seal the opening, a gas inlet formed in the housing, and a plurality of nozzles disposed in or on at least one of the plurality of interior sidewalls, each of the plurality of nozzles in fluid communication with the gas inlet and the opening.

22 Claims, 4 Drawing Sheets

BALANCED PURGE SLIT VALVE

BACKGROUND OF THE INVENTION

1. Field of the Invention

Embodiments of the present invention generally relate to semiconductor processing.

2. Description of the Related Art

As the demand for semiconductor devices continues to grow, there is a constant need to increase manufacturing throughput without sacrificing device quality. Some methods use an apparatus for depositing or removing materials from a surface of a substrate, such as a semiconductor wafer. The apparatus typically includes a chamber having a process volume having a port for transfer of substrates in and out of the process volume. The port is typically selectively sealable by a valve or door having a compressible sealing device in contact with the port and valve or door when closed.

The process gases introduced in the process volume used to deposit or remove materials tend to degrade the compressible sealing device. Over time, the vacuum seal is degraded to a point where replacement of the seal is necessary. Replacement of the vacuum seal is time consuming and decreases throughput of the chamber.

Thus, there is a need for an apparatus and method to improve the service life of the vacuum seal.

SUMMARY OF THE INVENTION

Methods and apparatus for providing a gas to a slit valve opening are provided herein. In one embodiment, a slit valve is described. The slit valve includes a housing having an opening, the opening defined by a plurality of interior sidewalls and sized to allow a substrate to pass therethrough, a door sized to selectively seal the opening, a gas inlet formed in the housing, and a plurality of nozzles disposed in or on at least one of the plurality of interior sidewalls, each of the plurality of nozzles in fluid communication with the gas inlet and the opening.

In another embodiment, a slit valve is described. The slit valve includes a housing having an opening, the opening defined by a plurality of interior sidewalls and sized to allow a substrate to pass therethrough, a door sized to selectively seal the opening, a gas inlet formed in the housing, and a plurality of nozzles in fluid communication with the gas inlet and the opening, each of the plurality of nozzles disposed in at least two of the plurality of interior sidewalls, the at least two interior sidewalls opposing each other.

In another embodiment, an insert sized to be received by an opening in a slit valve is described. The insert includes a housing adapted to couple to at least one interior sidewall of the opening, a plurality of nozzles formed through at least one side of the housing in fluid communication with the opening, and a conduit coupled to the housing adapted to provide a purge gas to the opening through the plurality of nozzles.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention provide methods and apparatus for providing a purge gas to a slit valve or other transfer interface. In one embodiment, the slit valve includes a plurality of openings or nozzles coupled to a purge gas source. The openings are used to deliver the purge gas to an opening or tunnel within the transfer interface. In another embodiment, a purge gas may be provided to the opening or tunnel in the transfer interface by an insert that may be placed onto the transfer interface. The insert includes a plurality of openings or nozzles coupled to a purge gas source. The openings are used to deliver the purge gas to the opening or tunnel within the transfer interface.

Embodiments of slit valves in accordance with the present invention may be utilized in various process chambers. For example, suitable process chambers may include semiconductor substrate process chambers, vacuum processing chambers, thermal processing chambers, plasma processing chambers, annealing chambers, deposition chambers, etch chambers, implant chambers, or the like. Examples of suitable chambers include the QUANTUM® X implant chamber, and the CENTURA® RP EPI chamber, as well as other chambers available from Applied Materials, Inc. of Santa Clara, Calif. The inventive slit valves may also be used on other chambers available from other manufactures as well.

Figure 1:
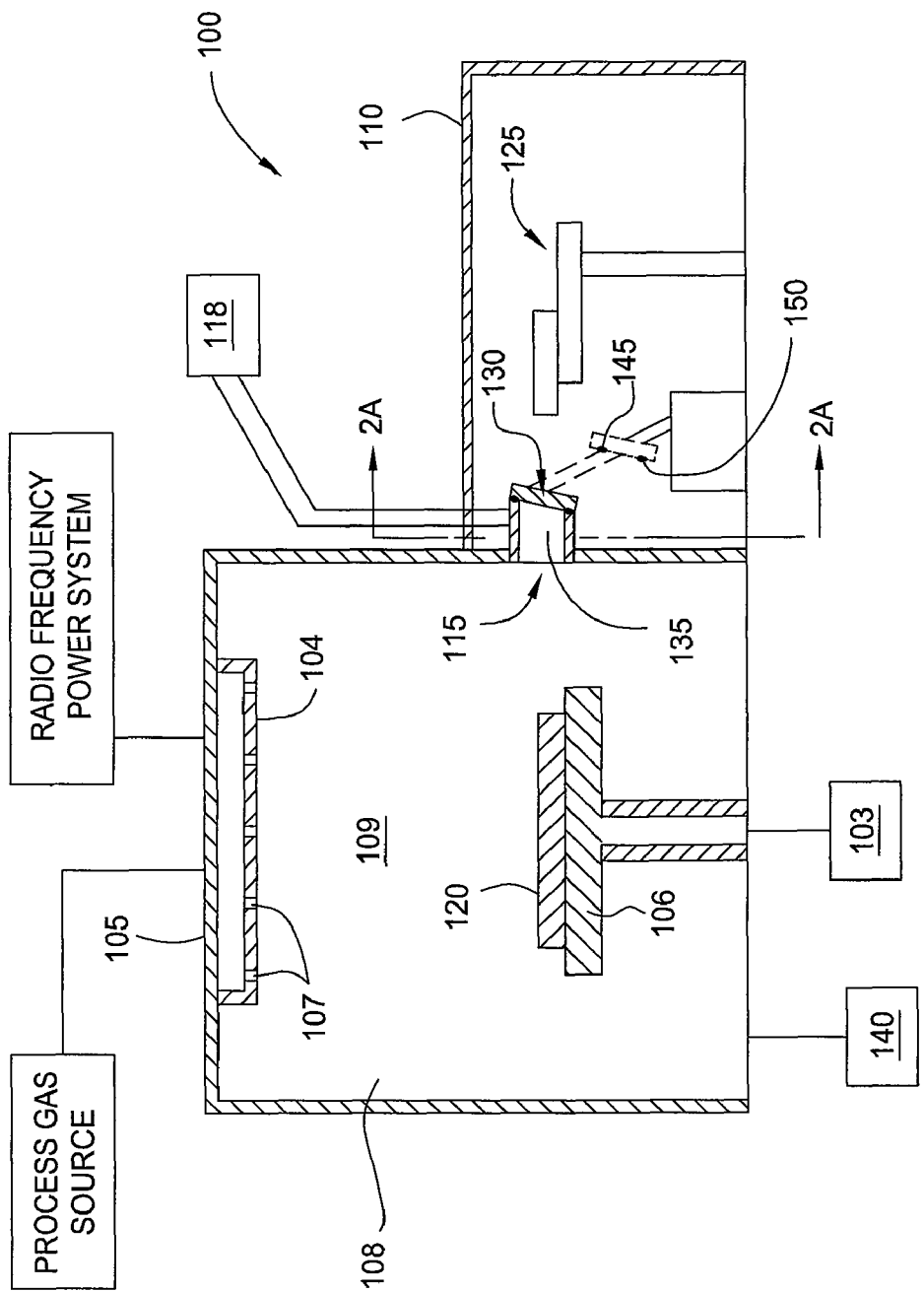
FIG. 1 is a schematic cross-sectional view of a processing system.

FIG. 1 is a schematic cross-sectional view of an exemplary processing system 100. The processing system 100 includes a process chamber 105 coupled to a transfer chamber 110 by a port 115. The port 115 is generally sized to facilitate passing of a substrate 120 therethrough by a substrate transfer device 125 during a substrate transfer operation. The transfer chamber 110 may be a vacuum transfer chamber, a load lock chamber, a factory interface, or other chamber suitable for transferring a substrate to or from the process chamber 105. Alternatively, in some embodiments, the transfer chamber 110 may not be present in the processing system 100. For example, the process chamber 105 may be a stand-alone unit adapted to process one or more substrates, wherein substrates are transferred in and out of the chamber 105 by a robot, or by hand.

The transfer device 125 may include a substrate transfer robot, such as those commonly used in load lock chambers and vacuum transfer chambers. The port 115 is selectively sealed by a valve, such as a slit valve 130. The slit valve 130 is selectively opened to transfer substrates between the process chamber 105 and the transfer chamber 110.

The process chamber 105 may be any suitable process chamber, as discussed above. The exemplary process chamber 105 includes an interior volume 108 having a substrate support pedestal 106 disposed therein for supporting a substrate 120 thereupon. The substrate support pedestal 106 is coupled to a motor 103 used to change the elevation of the substrate support pedestal 106 and may also rotate the substrate support pedestal 106.

A gas distribution plate or showerhead 104 is disposed in the interior volume 108 in an opposing relationship to the substrate support pedestal 106. The showerhead 104 is coupled to a process gas source and used to distribute a gas through a plurality of nozzles 107 to a processing region 109 above the substrate 120. The process chamber 105 is coupled to a radio frequency (RF) power system that is used to form a plasma of the process gas in the processing region 109. The RF power system includes an RF source and matching systems (not shown). The interior volume 108 is in selective communication with a vacuum pump 140 adapted to generate or maintain a desired pressure within the interior volume 108 and/or exhaust gases from the interior volume 108.

The slit valve 130 may be coupled to the sidewalls of the process chamber 105. In the embodiment shown, the slit valve 130 is disposed between the process chamber 105 and the transfer chamber 110 proximate the port 115 in the process chamber 105. The slit valve 130 has a tunnel or opening 135 that is aligned with the port 115 to facilitate passing the substrate 120 between the process chamber 105 and the transfer chamber 110.

A door 145 selectively opens and closes the slit valve 130 and thereby provides access to or isolates the interior volume 108 of the process chamber 105. The door 145 includes a compressible sealing device 150 which may be an o-ring or gasket that contacts an outer surface of the opening 135 to facilitate vacuum sealing of the opening 135. While the compressible sealing device 150 is shown coupled to the door 145, the compressible sealing device 150 may be alternatively coupled to the slit valve 130 in a position that circumscribes the opening 135, or in another position that facilitates providing a selective vacuum seal between the door 145 and the slit valve 130.

The slit valve 130 is coupled to a gas source 118 for providing one or more gases to the opening 135. In one embodiment, the gases from the gas source 118 flow through the opening 135 and away from the compressible sealing device 150 into the interior volume 108 of the chamber 105. In this embodiment, the one or more gases provided to the opening 135 provide a gas flow across at least one dimension of the opening 135, for example, the width and/or height of the opening 135. In one aspect, the gas flow across the width and/or height of the opening 135 provides a gas "curtain" that prevents or minimizes the presence of process gases within the interior volume 108 from reaching the door 145 and/or the compressible sealing device 150. The one or more gases may be a suitable gas or gases shielding the door 145 and/or compressible sealing device 150 from process gases in the interior volume 108. In one embodiment, the one or more gases provided by the gas source 118 may be an inert gas, for example, argon (Ar) and helium (He) among others. In another embodiment, the one or more gases provided by the gas source 118 may be nitrogen ($N_2$) or hydrogen ($H_2$) among others. In another embodiment, the one or more gases provided by the gas source 118 into the slit valve 130 may be utilized for treating the substrate 120 during processing.

In some embodiments, the slit valve 130 may include an inlet for coupling to the gas source 118 and a plurality of outlets distributed across the slit valve opening 135 in a configuration designed to provide a uniform gas flow across at least one dimension of the opening 135. One or more plenums may be provided between the inlet and the plurality of outlets to facilitate control over the flow of a gas or gases out of the plurality of outlets. In some embodiments, the geometry of the one or more plenums may be configured to control the flow of a gas or gases as desired. In some embodiments, the geometry of the plurality of outlets may be configured to control the flow of a gas or gases as desired.

Figure 2A:
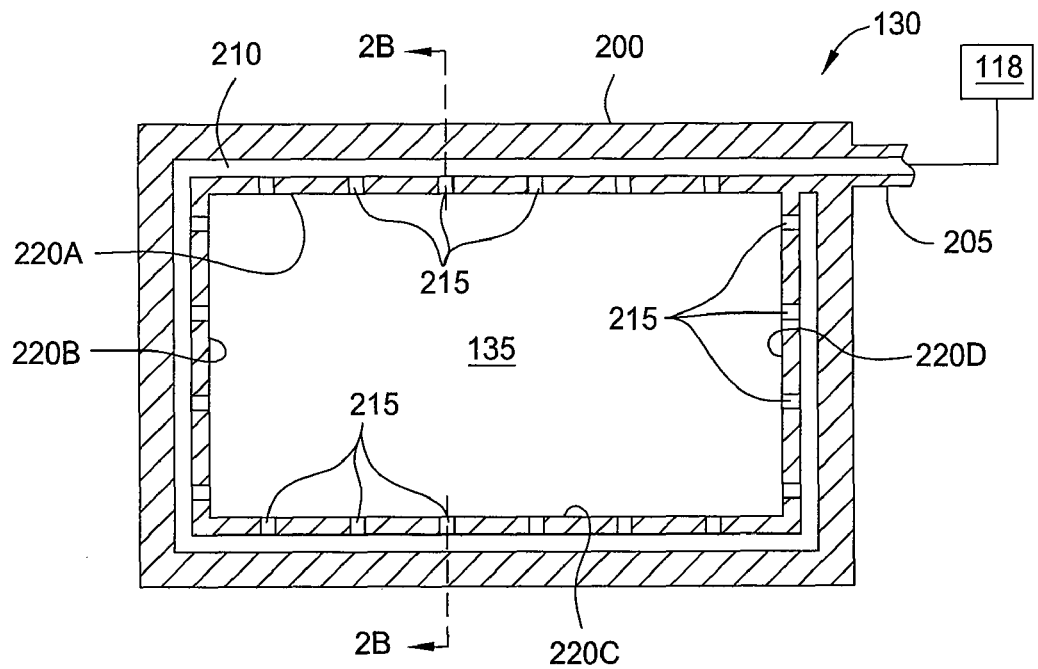
FIG. 2A is a cross-sectional view of one embodiment of a slit valve.

FIG. 2A is a cross-sectional view of one embodiment of the slit valve 130 of FIG. 1. The slit valve 130 includes a housing 200 having the tunnel or opening 135 disposed therethrough that provides access to the interior volume 108 of the process chamber 105 as shown in FIG. 1. A gas inlet 205 is provided in the housing 200 for coupling the slit valve 130 to a gas source 118. The gas inlet 205 may be fluidly coupled to a conduit 210 that, in one embodiment, surrounds the periphery of the opening 135. The conduit 210 provides a manifold that is fluidly coupled to a plurality of holes or nozzles 215. The holes or nozzles 215 direct a flow of a gas or gases from the gas source 118 across the interior volume of the opening 135. In one embodiment, the interior of the housing 200 includes four interior sides shown as 220A-220D defining the periphery of the opening 135, and the conduit 210 is disposed in the housing 200 and provides a gas or gases to the holes or nozzles 215 positioned on each interior side 220A-220D.

Figure 2B:
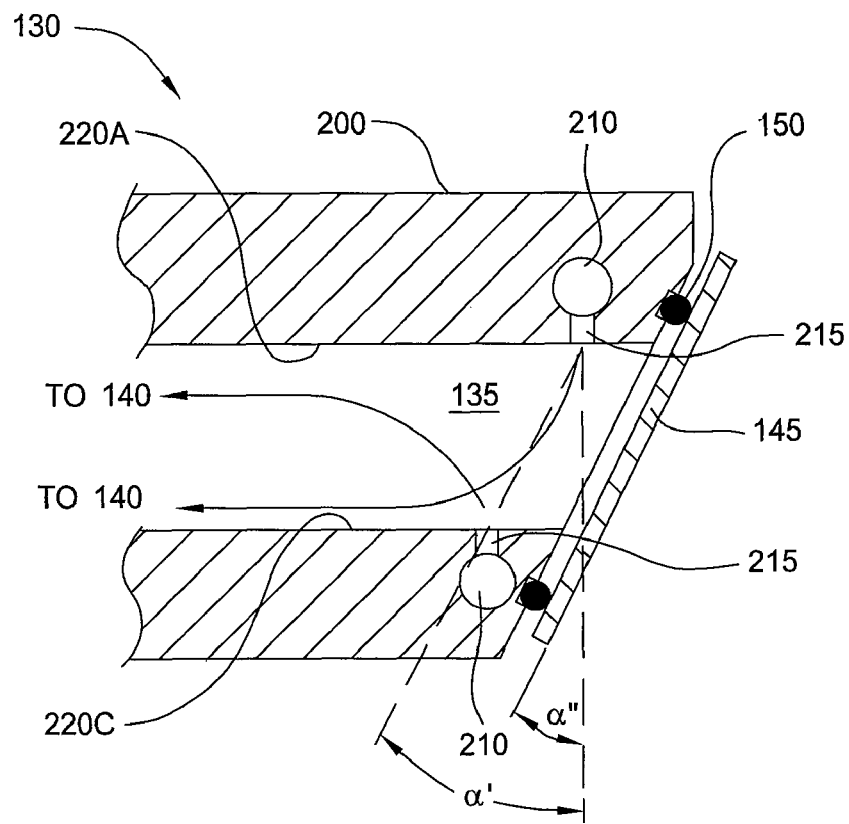
FIG. 2B is a side cross-sectional view of the slit valve of FIG. 2A.

FIG. 2B is a side cross-sectional view of the slit valve 130 of FIG. 2A. The nozzles 215 are positioned adjacent the door 145 to provide a gas flow across the opening 135, as shown by the arrows. In this embodiment, the gas or gases provided by the nozzles 215 are exhausted to the vacuum pump 140 (FIG. 1). In one embodiment, the nozzles 215 disposed in the interior sides 220A and 220B are disposed at an angle α' that may be substantially equal to an angle α" defined by the plane of the door 145 in a closed position relative to the longitudinal axis of the opening 135.

Figure 3A:
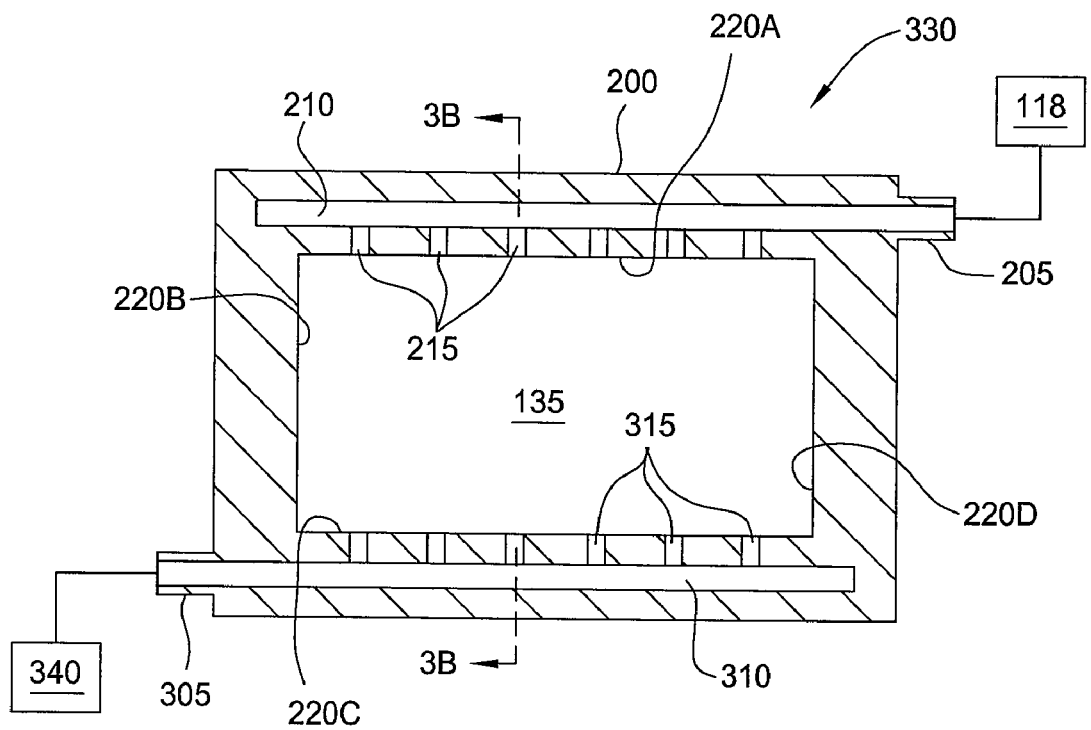
FIG. 3A is a cross-sectional view of another embodiment of a slit valve.

FIG. 3A is a cross-sectional view of another embodiment of a slit valve 330. In this embodiment, the gas inlet 205 is provided in the housing 200 for coupling the slit valve 330 to a gas source 118. The gas inlet 205 may be fluidly coupled to a conduit 210 that includes a plurality of nozzles 215 disposed through the interior sidewall 220A. Additionally, a gas outlet 305 is coupled to a conduit 310 that is in fluid communication with the opening 135 through a plurality of exhaust nozzles 315 disposed in the interior sidewall 220C. In this embodiment, the gas outlet 305 is coupled to a vacuum pump 340. In one embodiment, the vacuum pump 340 may be the vacuum pump 140 utilized to the evacuate process chamber 105 as shown in FIG. 1. Suitable conduits, valves and other plumbing (not shown) could be implemented to couple the gas outlet to the vacuum pump 140. In another embodiment, the vacuum pump 340 is a separate vacuum pump dedicated to exhausting a gas or gases from the opening 135. While not shown, at least a portion of one or both of the conduits 210, 310 may extend at least partially on or through the housing 200 to provide fluid communication to the opening 135 through the interior sides 220B and/or 220D.

Figure 3B:
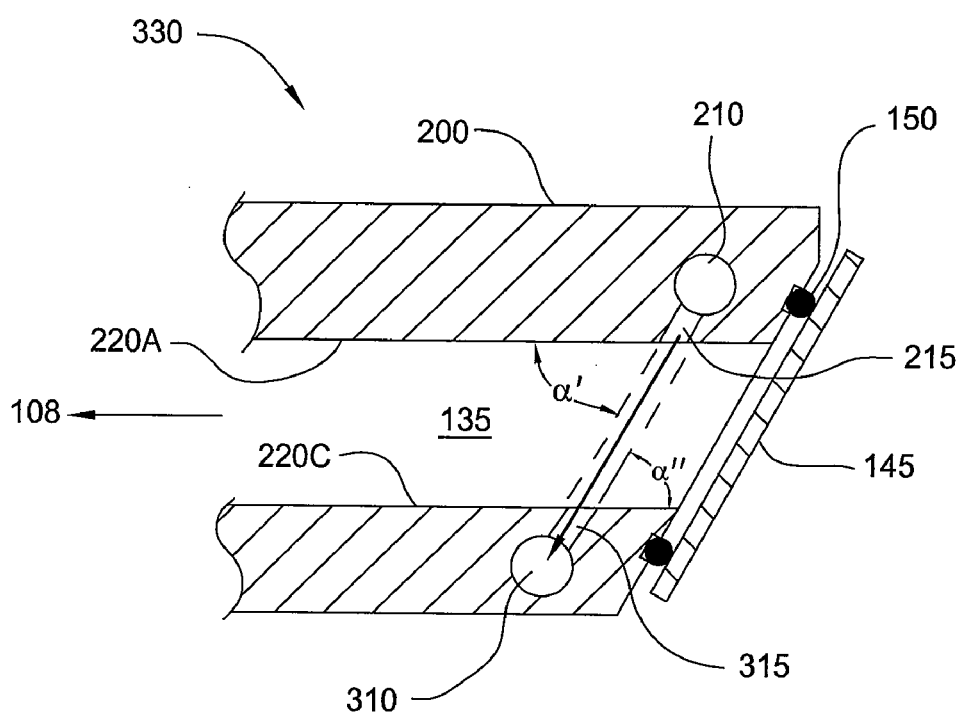
FIG. 3B is a side cross-sectional view of the slit valve of FIG. 3A.

FIG. 3B is a side cross-sectional view of the slit valve 330 of FIG. 3A. In this embodiment, a gas is provided to the opening 135 through interior side 220A. Although some gas flow may enter the interior volume 108, gas flow is directed in the general direction as shown by the arrow to the exhaust nozzles 315. In one embodiment, the inlet nozzles 215 disposed in the interior sidewall 220A are directed at an angle α' relative to the longitudinal or horizontal plane of the interior sidewall 220A. Likewise, the exhaust nozzles 315 are directed at an angle α" relative to the longitudinal plane of the interior sidewall 220C. In one embodiment, one or both of the angles α' and α" are the same as the angle of the door 145 in a closed position relative to the housing 200. In one embodiment, one or both of the angles α' and α" are between about 0° to about 55° relative to the plane of the interior sidewall 220A and 220C, for example, between about 10° to about 35° relative to the plane of the interior sidewall 220A and 220C.

In one embodiment, the door 145 in a closed position is angled relative to the housing 200 and/or the longitudinal or horizontal plane of the interior sidewalls 220A, 220C at about 45°. In other embodiments, the door 145 in a closed position may be substantially normal relative to the housing 200 and/or the longitudinal or horizontal plane of the interior sidewalls 220A, 220C. In other embodiments, the door 145 in a closed position may be angled greater than about 45° or any angle between about 90° to about 45° relative to the housing 200 and/or the longitudinal or horizontal plane of the interior sidewalls 220A, 220C.

Figure 4A:
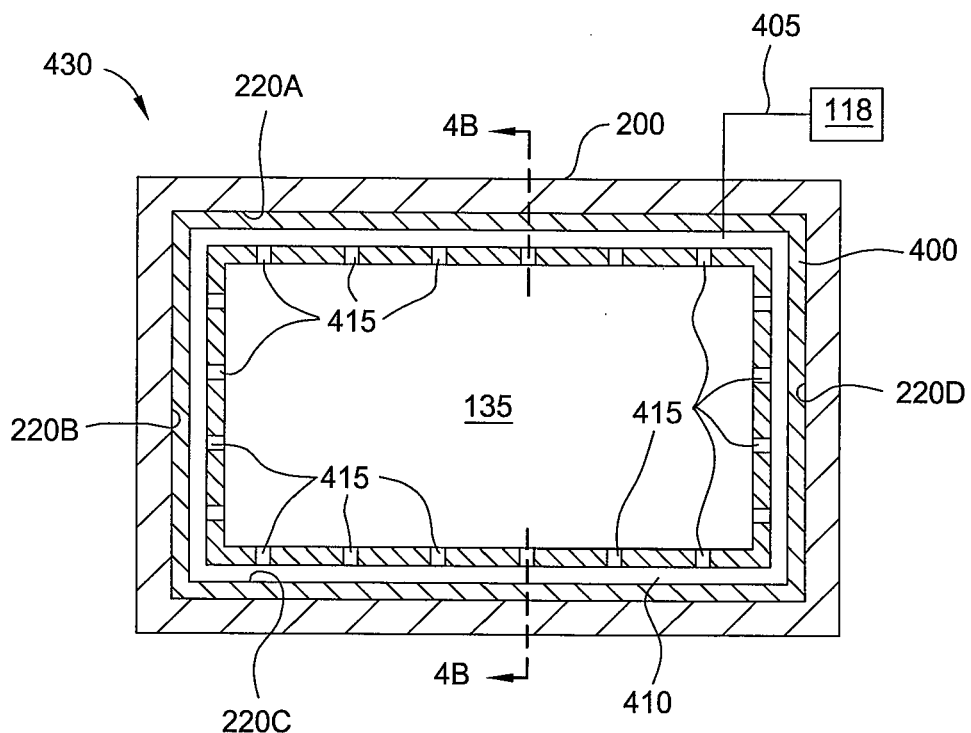
FIG. 4A is a cross-sectional view of another embodiment of a slit valve.

FIG. 4A is a cross-sectional view of another embodiment of a slit valve 430. In this embodiment, the slit valve 430 includes a purge liner 400. The liner 400 includes a conduit 410 that is coupled to the gas source 118 by appropriate plumbing, such as a feed conduit 405. The liner 400 also includes a plurality of nozzles 415 fluidly coupling the conduit 410 to the opening 135. In one embodiment, the liner 400 comprises a four-sided frame and is configured as an insert that may be retrofitted and coupled to at least one interior side of the opening 135 to provide a gas across a dimension of the opening 135. The liner 400 may be sized according to the dimensions of the opening 135 and coupled to the at least one interior side by a fastener (not shown), a weld, or other bond. In one embodiment, the liner 400 is sized to press-fit within the opening 135 and is held in place by friction.

In the embodiment shown, the liner 400 surrounds the opening 135 and is configured to provide a gas to the opening 135. However, it is understood that the conduit 410 may be divided into two passages so that a portion of the nozzles 415 may function as exhaust openings while the other portion of nozzles 415 function as gas inlets. For example, one passage may be coupled to the gas source 118 while the second passage may be coupled to a vacuum pump (not shown). In this example, a portion of the nozzles 415 coupled to the first passage provide a gas from the gas source 118 to the opening 135 while the remaining nozzles 415 coupled to the second passage exhaust the gas from the opening 135.

Figure 4B:
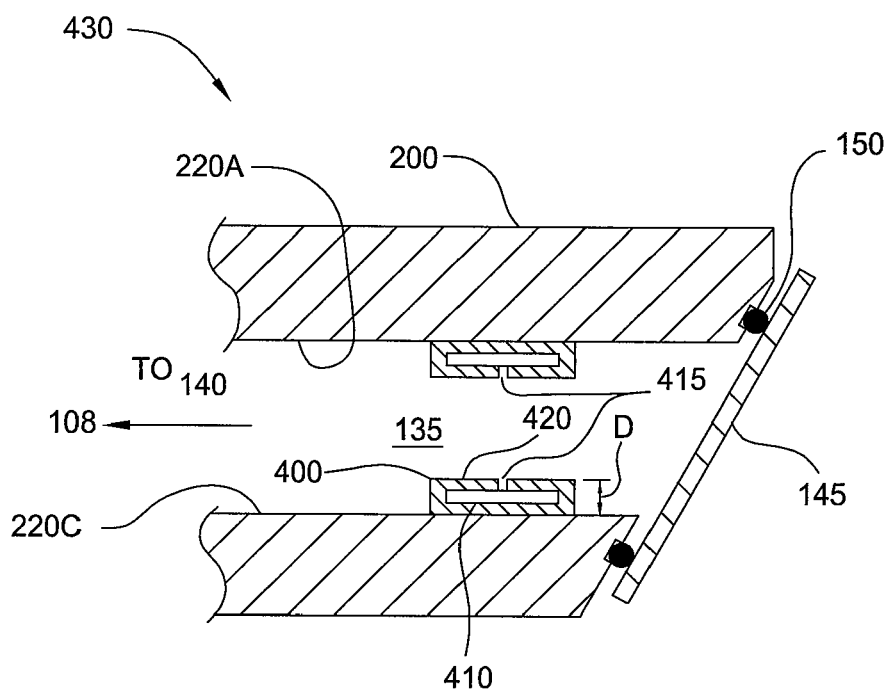
FIG. 4B is a side cross-sectional view of the slit valve of FIG. 4A.

FIG. 4B is a side cross-sectional view of the slit valve 430 of FIG. 4A. The purge liner 400 includes a body 420 having a cross-sectional diameter D that is adapted to not interfere with substrate transfer through the opening 135. The conduit 410 is formed therein to include a volume to provide a sufficient quantity of gas to the nozzles 415. Additionally, in this embodiment, the plurality of nozzles 415 on the interior sides are substantially aligned and opposing each other.

EXAMPLES

Test results using embodiments described above show a significant decrease in the concentration of process gases in the opening 135 as compared to process gas concentrations in a conventional slit valve tunnel. A control simulation using a process gas, which in this example is boron trifluoride ($BF_3$), was flowed to a chamber at 100 sccm having no gas inlets or gas outlets communicating with the opening 135. The vacuum pump 140 of the chamber was open and the interior volume 108 was maintained at about 10 mTorr. The interior volume 108 and the opening 135 were monitored for gas concentrations during the simulations. The opening 135 was monitored at two locations: at the top (interior sidewall 220A) and the bottom (interior sidewall 220C). The entire interior volume 108 was monitored to determine gas concentration at the port 115, across the substrate 120 and the volume of the chamber opposing the port 115. Using the above process conditions, a uniform concentration of process gas was observed to substantially occupy the entire process volume 108, including the opening 135 on the process chamber side of the door 145.

Example 1

Example 1 was performed using a slit valve 130 according to embodiments described herein using the same process conditions as described in the control simulation, with the exception of an argon flow at 5 sccm into the opening 135 through nozzles in the interior sidewall 220A and allowed to exhaust to the vacuum pump 140. Process gas concentration was shown to decrease in the opening 135 adjacent the interior sidewall 220A while the process gas concentration across the substrate 120 and other portions of the interior volume 108 remained uniform.

Example 2

Example 2 was performed using a slit valve 130 according to embodiments described herein using the same process conditions as described in the control simulation, with the exception of an argon flow at 5.0 sccm into the opening 135 through nozzles 215 in the interior sidewall 220A. In this example, the opening 135 included a plurality of nozzles 315 in interior sidewall 220C as described in FIG. 3A. The plurality of nozzles 315 were coupled to a vacuum pump to exhaust the opening 135. Process gas concentration was shown to decrease in the opening 135 adjacent the interior sidewall 220A while a slight increase of process gas was detected at the interior sidewall 220C as compared to Example 1. A slight increase in process gas concentration as compared to Example 1 was also detected at the port 115. The process gas concentration across the substrate 120 and other portions of the interior volume 108 remained uniform.

Example 3

Example 3 was performed using a slit valve 130 according to embodiments described herein using the same process conditions as described in the control simulation, with the exception of an argon flow into the opening 135 through nozzles in the interior sidewalls 220A and 220C. An argon flow of 5.0 sccm was provided to the opening 135 and divided such that 2.5 sccm of argon was flowed to the nozzles in the interior sidewall 220A and 2.5 sccm of argon was flowed to the nozzles in the interior sidewall 220C. The argon provided to the opening 135 was allowed to exhaust to the vacuum pump 140. Process gas concentration was shown to decrease in the opening 135 adjacent the interior sidewalls 220A and 220C while the process gas concentration across the substrate 120 and other portions of the interior volume 108 remained uniform.

Example 4

Example 4 was performed using a slit valve 130 according to embodiments described herein using the same process conditions as described in the control simulation, with the exception of a helium flow into the opening 135 through nozzles in the interior sidewalls 220A and 220C. A helium flow of 5.0 sccm was provided to the opening 135 and divided such that 2.5 sccm of helium was flowed to the nozzles in the interior sidewall 220A and 2.5 sccm of helium was flowed to the nozzles in the interior sidewall 220C. The helium provided to the opening 135 was allowed to exhaust to the vacuum pump 140. Process gas concentration was shown to decrease in the opening 135 adjacent the interior sidewalls 220A and 220C. A slight increase in process gas concentration as compared to Example 3 was also detected at the port 115. The process gas concentration across the substrate 120 and other portions of the interior volume 108 remained uniform.

Embodiments of the slit valves 130, 330 and 430 as described herein provide a gas to an opening 135 prevent or minimize the introduction and/or accumulation of process gases in the opening 135 adjacent the door 145. The gas provided to the opening 135 prevents or minimizes process gases from reaching the compressible sealing device 150, such as an o-ring or gasket, that seals the opening 135. Thus, the compressible sealing device 150 is protected from the process gases, which extends the usable lifetime of the compressible sealing device 150.

While the foregoing is directed to embodiments of the invention, other and further embodiments of the invention may be devised without departing from the basic scope thereof, and the scope thereof is determined by the claims that follow.

What is claimed is:

1. A slit valve, comprising:
   a housing having an opening, the opening defined by a plurality of interior sidewalls and sized to allow a substrate to pass therethrough;
   a door sized to selectively seal the opening;
   a gas inlet formed in the housing; and
   a plurality of nozzles disposed in or on at least one of the plurality of interior sidewalls, each of the plurality of nozzles in fluid communication with the gas inlet and the opening.

2. The slit valve of claim 1, wherein the plurality of nozzles are coupled to a conduit formed in the housing.

3. The slit valve of claim 1, wherein the plurality of nozzles circumscribe the opening.

4. The slit valve of claim 1, further comprising:
   an insert disposed in the opening, the insert having the plurality of nozzles formed therein.

5. The slit valve of claim 4, wherein the insert lines a periphery of the opening.

6. The slit valve of claim 1, wherein the housing includes four interior sidewalls and the plurality of nozzles are formed in each of the four interior sidewalls.

7. The slit valve of claim 1, wherein the plurality of nozzles are disposed in or on opposing first and second interior sidewalls.

8. The slit valve of claim 1, further comprising:
   a plurality of exhaust nozzles in communication with the opening and coupled to an exhaust pump.

9. The slit valve of claim 7, wherein the door is disposed at a first angle relative to the opening and the plurality of nozzles on opposing sidewalls are disposed at a second angle relative to the opening, the first angle and the second angle being substantially equal.

10. A slit valve, comprising:
    a housing having an opening, the opening defined by a plurality of interior sidewalls and sized to allow a substrate to pass therethrough;
    a door sized to selectively seal the opening;
    a gas inlet formed in the housing; and
    a plurality of nozzles in fluid communication with the gas inlet and the opening, each of the plurality of nozzles disposed in at least two of the plurality of interior sidewalls, the at least two interior sidewalls opposing each other.

11. The slit valve of claim 10, wherein the door is disposed at a first angle relative to the opening in a closed position and the plurality of nozzles are disposed at a second angle relative to the opening, the first and second angle being different.

12. The slit valve of claim 11, wherein the first angle is about 45° and the second angle is about 0°.

13. The slit valve of claim 12, wherein the plurality of nozzles disposed on the interior sidewalls are disposed in an opposing relationship to each other.

14. The slit valve of claim 10, wherein the door is disposed at a first angle relative to the housing in a closed position and the plurality of nozzles on the opposing sidewalls are disposed at a second angle relative to the housing, the first angle and the second angle being substantially equal.

15. The slit valve of claim 10, wherein a portion of the plurality of nozzles are disposed normal to the housing.

16. The slit valve of claim 10, wherein the plurality of nozzles disposed on the interior sidewalls are disposed in an opposing relationship to each other.

17. The slit valve of claim 10, wherein the housing includes four interior sidewalls and the plurality of nozzles are formed in each of the four interior sidewalls.

18. An insert sized to be received by an opening in a slit valve, the insert comprising:
    a housing adapted to couple to at least one interior sidewall of the opening;
    a plurality of nozzles formed through at least one side of the housing in fluid communication with the opening; and
    a conduit coupled to the housing adapted to provide a purge gas to the opening through the plurality of nozzles.

19. The apparatus of claim 18, wherein the housing surrounds an inner periphery of the opening.

20. The apparatus of claim 18, wherein the opening comprises four interior sidewalls and the housing comprises a four sided frame that is adjacent each interior sidewall.

21. The apparatus of claim 20, wherein the plurality of nozzles are disposed on opposing sides of the frame.

22. The apparatus of claim 20, wherein the plurality of nozzles are disposed on each side of the frame.

* * * * *